(12) United States Patent
Tagawa (10) Patent No.: US 11,211,892 B2
(45) Date of Patent: Dec. 28, 2021

(54) MOTOR DRIVE APPARATUS CONFIGURED TO DETERMINE CAUSE OF DC LINK VOLTAGE FLUCTUATION

(71) Applicant: Fanuc Corporation, Yamanashi (JP)

(72) Inventor: Takaaki Tagawa, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 16/951,008

(22) Filed: Nov. 18, 2020

(65) Prior Publication Data

US 2021/0167715 A1 Jun. 3, 2021

(30) Foreign Application Priority Data

Dec. 3, 2019 (JP) .............................. JP2019-219030

(51) Int. Cl.
*H02P 29/024* (2016.01)
*H02P 27/06* (2006.01)

(52) U.S. Cl.
CPC ............ *H02P 29/026* (2013.01); *H02P 27/06* (2013.01); *H02P 2201/03* (2013.01)

(58) Field of Classification Search
CPC ..... H02P 29/026; H02P 27/06; H02P 2201/03
See application file for complete search history.

(56) References Cited

U.S. PATENT DOCUMENTS

| 2013/0181640 A1* | 7/2013 | Fukuta | H03K 17/063 |
| | | | 318/139 |
| 2017/0005588 A1* | 1/2017 | Kato | H02M 7/06 |
| 2018/0212549 A1* | 7/2018 | Yoshida | H02P 29/025 |

FOREIGN PATENT DOCUMENTS

| JP | 2011217518 A | 10/2011 |
| JP | 2012151959 A | 8/2012 |
| JP | 2015216018 A | 12/2015 |
| JP | 2018102082 A | 6/2018 |
| JP | 2018121408 A | 8/2018 |
| JP | 2019138656 A | 8/2019 |

* cited by examiner

*Primary Examiner* — Zoheb S Imtiaz
(74) *Attorney, Agent, or Firm* — RatnerPrestia (57) ABSTRACT

A motor drive apparatus includes: a rectifier; an inverter; a DC link voltage detection unit; an input current detection unit configured to detect input current inputted to the rectifier; a DC link voltage comparison unit configured to compare a DC link voltage with a first voltage threshold value and with a second voltage threshold value; a current comparison unit configured to compare the input current with a current threshold value; and an abnormality detection unit configured, in a case that the DC link voltage is smaller than the first voltage threshold value or that the DC link voltage is greater than the second voltage threshold value, to determine that a first abnormality has occurred when the input current is smaller than the current threshold value and to determine that a second abnormality has occurred when the input current is equal to or greater than the current threshold value.

7 Claims, 4 Drawing Sheets

MOTOR DRIVE APPARATUS CONFIGURED TO DETERMINE CAUSE OF DC LINK VOLTAGE FLUCTUATION

CROSS-REFERENCE TO RELATED APPLICATIONS

This application is a new U.S. Patent Application that claims benefit of Japanese Patent Application No. 2019-219030, filed Dec. 3, 2019, the disclosure of which is incorporated herein by reference in its entirety for all purposes.

BACKGROUND OF THE INVENTION

1. Field of the Invention

The present invention relates to a motor drive apparatus configured to determine a cause of a DC link voltage fluctuation.

2. Description of the Related Art

In motor drive apparatuses for the drive control of motors in machine tools, forging machinery, injection molding machines, industrial machinery, or various robots, AC power supplied from an AC power supply is converted by a rectifier to DC power, which is outputted to a DC link, and DC power in the DC link is converted by an inverter to AC power, which is supplied to the motor as the power for driving the motor. A "DC link" is a part of the circuit that electrically connects the DC output side of the rectifier and the DC input side of the inverter and it is also referred to as a "DC link unit", "direct current link", "direct current link unit", "direct current bus bar", or "alternate current intermediate circuit". A DC link has a DC link capacitor.

In general, a DC link capacitor has a capacity smaller than that of the power supply. Thus, for example, when the motor is accelerated when AC power from the AC power supply ceases to be supplied to the rectifier in the motor drive apparatus for some reason, all the energy for accelerating the motor is supplied from the DC link capacitor alone and the DC link voltage drops instantly. Further, for example, when, for some reason, the regenerative feedback to the AC power supply via the rectifier is insufficient at the time of motor deceleration, the DC link voltage increases instantly.

In a motor drive apparatus, the motor ceases to function normally when the DC link voltage, which is voltage between the DC link terminals, decreases or increases significantly for some reason. This may result in various troubles, such as breakages and deformations of not only the motor drive apparatus but also the motor driven by the motor drive apparatus, various devices connected to the motor, various systems including the motor drive apparatus. To prevent this, an alarm signal is outputted from the control apparatus in the motor drive apparatus when the DC link voltage decreases or increases significantly. Based on this alarm signal, the emergency stop and protection operations of the motor drive apparatus are performed to avoid or minimize the troubles described above.

Japanese Unexamined Patent Publication No. 2018-121408, for example, discloses a motor drive apparatus with a function to detect an abnormality in a power supply input unit between the apparatus and a power supply, including: a converter configured to receive AC power as input from the power supply via the power supply input unit and to convert the AC power to DC power; an inverter configured to convert the DC power from the converter to AC power; a DC link capacitor provided in a DC link between the converter and the inverter; a voltage detection unit configured to detect voltage across the DC link capacitor; and an abnormality detection unit configured to calculate a voltage change amount over a predefined time period based on voltage values detected by the voltage detection unit and to detect an abnormality based on the calculated voltage change amount.

Japanese Unexamined Patent Publication No. 2015-216018, for example, discloses a motor drive apparatus including: an AC/DC conversion unit configured to convert AC voltage supplied from an AC power supply to DC voltage; an electromagnetic contactor configured to perform switching to connect or disconnect the AC power supply and the AC/DC conversion unit; a DC link unit configured to smooth DC voltage outputted from the AC/DC conversion unit; a DC/AC conversion unit configured to convert DC voltage smoothed by the DC link unit to AC voltage for driving a motor; a DC link voltage detection unit configured to measure voltage between terminals of the DC link unit; and a control unit configured to transmit a command to connect or disconnect the electromagnetic contactor and configured to control the AC/DC conversion unit, wherein the control unit includes: a time measuring unit configured to measure elapsed time since the switching by the electromagnetic contactor; and a fusion determination unit configured to determine that the electromagnetic contactor is fused when a difference between a voltage between the terminals of the DC link unit measured after charging the DC link unit by connecting the AC power supply with the AC/DC conversion unit and a voltage between the terminals of the DC link unit measured after an elapse of predefined time since the control unit transmitted a command to disconnect the connection between the AC power supply and the AC/DC conversion unit after the charging of the DC link unit is smaller than a predefined voltage value.

Japanese Unexamined Patent Publication No. 2018-102082, for example, discloses a motor drive apparatus including: at least one inverter configured to convert DC power to AC power, wherein the DC power is supplied from a converter configured to convert AC power into DC power; a DC link capacitor provided for each of the inverters in a DC link between the converter and the inverter; a first current detection unit configured to detect current flowing between the converter and the DC link capacitor in the DC link; a second current detection unit configured to detect current flowing between the DC link capacitor and the inverter in the DC link; voltage detection unit configured to detect voltage across the DC link capacitor; and a capacitance decline detection unit configured to calculate, from an integrated value calculated by integrating a difference between a current value detected by the first current detection an it and a current value detected by the second current detection unit over a predefined time, a change amount in electric charge of the DC link capacitor for the predefined time, configured to calculate a change amount in voltage across the DC link capacitor for the predefined time, based on a voltage value detected by the voltage detection unit, configured to calculate a capacitance value of the DC link capacitor, based on the calculated change amount in electric charge and the calculated change amount in voltage, and configured to detect a capacitance decline in the DC link capacitor, based on the calculated capacitance value.

Japanese Unexamined Patent Publication No. 2012-151959, for example, discloses in paragraph [0003] that "some of the power conversion apparatuses of this type include abnormality detection means for detecting an abnormality (e.g., momentary voltage decline) in source voltage to protect the inverter unit and the like".

Japanese Unexamined Patent Publication No. 2019-138656, for example, discloses a motor drive apparatus including: a converter configured to convert AC power inputted from an AC power supply to DC power and to output the DC power; a DC link unit connected in parallel with a DC output side of the converter and including a plurality of capacitors connected in series with each other; an inverter connected in parallel with the DC link unit and configured to output DC power in the DC link unit into AC power as the power for driving a motor and to output the AC power; and a short circuit determination unit configured to compare a value of DC current flowing between the DC link unit and the inverter with a predefined first threshold value and to compare a value of input current flowing from the AC power supply to the DC link unit via the converter with a predefined second threshold value and configured to determine that at least one of the plurality of capacitors in the DC link unit is short-circuited in a case in which, as a result of the comparison, the value of the DC current flowing between the DC link unit and the inverter is smaller than the first threshold value while the value of the input current flowing from the AC power supply to the DC link unit via the converter is greater than the second threshold value.

Japanese Unexamined Patent Publication No. 2011-217518, for example, discloses a motor drive apparatus including: an AC/DC conversion unit configured to convert three-phase AC power supplied from a three-phase AC power supply into DC power; and a DC/AC conversion unit configured to convert the DC power outputted from the AC/DC conversion unit into three-phase AC power and to supply the AC power to a motor, the motor drive apparatus further including: a sum current detection unit configured to detect a sum of currents flowing from the three-phase AC power supply via the AC/DC conversion unit to the DC/AC conversion unit; an overcurrent detection unit configured to detect overcurrent on an output current of the DC/AC conversion unit; and a determination unit configured, when overcurrent is detected by the overcurrent detection unit, to determine that a ground fault has occurred when the sum of currents detected by the sum current detection unit has been determined to be not zero and to determine that a phase-to-phase short circuit has occurred when the sum of currents detected by the sum current detection unit has been determined to be zero.

SUMMARY OF INVENTION

The cause of a significant decrease or increase in DC link voltage may be, for example, a power failure of the AC power supply over a prolonged period, a momentary power failure, capacity shortage of the power source equipment, overload, a failure in the motor drive apparatus itself, and shutoff in a breaker or an electromagnetic contactor, or the like. The phenomenon as it is of a significant decrease or increase in DC link voltage can be detected based on the output of an alarm signal or a result of DC link voltage measurement, but it takes time and effort to identify the cause. Generally, when a significant decrease or increase in DC link voltage has occurred, the operator starts examining the cause of the significant decrease or increase in DC link voltage by looking at the motor drive apparatus first. However, when the cause of the significant decrease or increase in DC link voltage lies outside the motor drive apparatus, it will take a long time to find the real cause. As the machine driven by the motor drive apparatus is kept out of operation while the examination of the cause by the operator is underway, the operation rate of the machine declines.

Further, the operator will take different reactions, depending on the cause of the significant decrease or increase in DC link voltage. For example, when the cause of the significant decrease or increase in DC link voltage is not a failure in the motor drive apparatus itself, the operator does not need, in principle, to replace the motor drive apparatus itself or to replace or repair a component inside the motor drive apparatus. However, when the cause of the significant decrease or increase in DC link voltage is not accurately identified, the operator may erroneously think that the motor drive apparatus failed even when the motor drive apparatus is working normally. As a result, the operator may end up in unnecessary replacement of the normal motor drive apparatus itself or unnecessary replacement or repair of a component inside the motor drive apparatus, which would be uneconomical.

Therefore, in a motor drive apparatus in which a rectifier and an inverter are connected via a DC link, there is a demand for technology to identify easily and accurately the cause of a significant decrease or increase in DC link voltage.

According to one aspect of the present disclosure, a motor drive apparatus includes: a rectifier configured to convert AC power inputted from an AC input side to DC power and to output the DC power to a DC link which is on a DC output side; an inverter configured to convert DC power in the DC link to AC power for driving a motor and to output the AC power; a DC link voltage detection unit configured to detect DC link voltage, which is voltage between terminals of the DC link; an input current detection unit configured to detect input current inputted to the rectifier from the AC input side; a DC link voltage comparison unit configured to compare the DC link voltage with a first voltage threshold value and with a second voltage threshold value, which is set at a greater value than the first voltage threshold value; a current comparison unit configured to compare the input current with a current threshold value; and an abnormality detection unit configured, in a case in which the DC link voltage comparison unit has determined that the DC link voltage is smaller than the first voltage threshold value or that the DC link voltage is greater than the second voltage threshold value, to determine that a first abnormality has occurred when the current comparison unit has determined that the input current is smaller than the current threshold value and to determine that a second abnormality has occurred when the current comparison unit has determined that the input current is equal to or greater than the current threshold value.

BRIEF DESCRIPTION OF THE DRAWINGS

The present invention will be more clearly understood with reference to the following accompanying drawings.

DETAILED DESCRIPTION

A motor drive apparatus configured to determine a cause of DC link voltage fluctuation will be described below with reference to the drawings. To facilitate understanding, the drawings are presented with different scales as appropriate. The embodiments illustrated in the drawings are merely illustrative and the present invention is not limited to the embodiments illustrated in the drawings.

Figure 1:
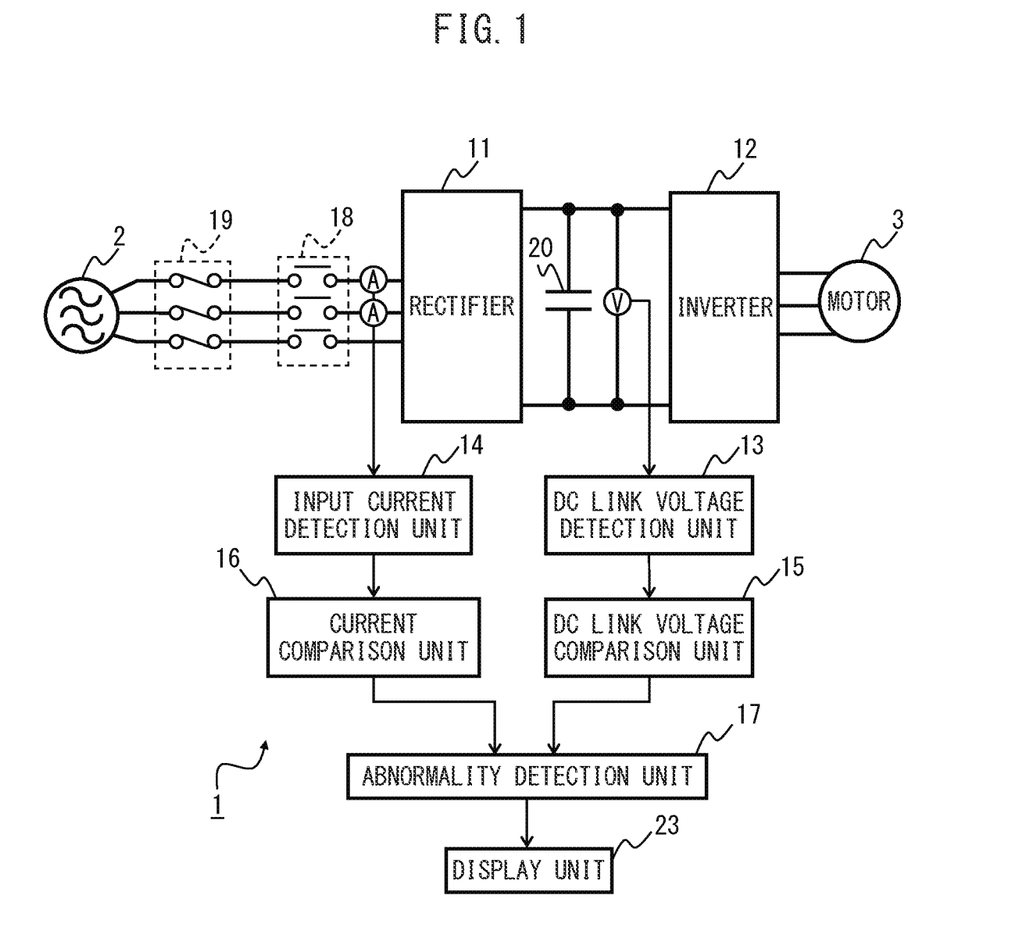
FIG. 1 is a diagram illustrating a motor drive apparatus according to one embodiment of the present disclosure.

FIG. 1 is a diagram illustrating a motor drive apparatus according to one embodiment of the present disclosure.

A case in which a motor drive apparatus 1 connected with an AC power supply 2 controls a motor 3 will be described as an example. In the present embodiment, the motor 3 is not limited to a particular kind and may be, for example, an induction motor or a synchronous motor. Further, the number of phases of electric power from the AC power supply 2 and the number of phases of electric power for the motor 3 are not limited in a particular way in the present embodiment and the powers may have, for example, three phases or a single phase. In the examples illustrated in the drawings, the electric power from the AC power supply 2 and the electric power for the motor 3 are both in three phases. The AC power supply 2 may be, for example, a three-phase 400V AC power supply, three-phase 200V AC power supply, three-phase 600V AC power supply, single-phase 100V AC power supply, or the like. The machinery for which the motor 3 may be provided may be, for example, machine tools, robots, forging machinery, injection molding machines, industrial machinery, various electric appliances, trains, motorcars, airplanes, or the like.

As illustrated in FIG. 1, the motor drive apparatus 1 according to one embodiment of the present disclosure includes a rectifier 11, an inverter 12, a DC link voltage detection unit 13, an input current detection unit 14, a DC link voltage comparison unit 15, a current comparison unit 16, and an abnormality detection unit 17. Further, the motor drive apparatus 1 includes an electromagnetic contactor 18 as a first switching unit, a breaker 19 as a second switching unit, and a display unit 23.

The rectifier 11 converts AC power inputted from the AC input side to DC power and outputs the DC power to the DC link, which is on the DC output side. The rectifier 11 is configured to be a three-phase bridge circuit when the AC power supply 2 supplies three-phase AC power thereto, and configured to be a single-phase bridge circuit when the AC power supply 2 supplies single-phase AC power. In the example illustrated in the drawing, the rectifier 11 configured to be a three-phase bridge circuit as the AC power supply 2 is a three-phase AC power supply. The rectifier 11 may be, for example, a diode rectifier, a 120-degree conduction system rectifier, or a PWM switching control system rectifier, or the like. For example, when the rectifier 11 is a 120-degree conduction system rectifier or a PWM switching control system rectifier, the rectifier 11 is configured by a bridge circuit including switching devices and diodes in inverse-parallel connection with the switching devices and performs bidirectional AC/DC power conversion as the switching devices are on-off controlled according to drive commands received from a superordinate control device (not illustrated). In this case, the switching devices may be, for example, FETs, IGBTs, thyristors, gate turn-off thyristors (GTOs), or transistors, or may be other semiconductor devices. Note that an AC reactor and an AC line filler may be provided on the AC input side of the rectifier 11, which are not illustrated in the drawing.

The electromagnetic contactor 18 as the first switching unit is provided on the AC input side of the rectifier 11, and opens and closes the current path for the input current from the AC input side to the rectifier 11. The closing operation, or the formation of the current path for the input current from the AC input side to the rectifier 11 is implemented by closing the contacts of the electromagnetic contactor 18, and the opening operation, or the cutting off of the current path for the input current from the AC input side to the rectifier 11 is implemented by opening the contacts of the electromagnetic contactor 18. Note that, for the first switching unit, a semiconductor switching device configured to open and close the current path for the input current from the AC input side to the rectifier 11 may be used, instead of the electromagnetic contactor 18.

The breaker 19 as the second switching unit is provided between the AC power supply 2, which is the supply source of AC power inputted to the rectifier 11, and the electromagnetic contactor 18, and opens and closes the current path from the AC power supply 2 to the electromagnetic contactor 18. The closing operation, or the formation of the current path from the AC power supply 2 to the electromagnetic contactor 18, is implemented by closing the contacts of the breaker 19, and the opening operation, or the cutting off of the current path from the AC power supply 2 to the electromagnetic contactor 18, is implemented by opening the contacts of the breaker 19. Note that, for the second switching unit, a semiconductor switching device configured to open and close the current path from the AC power supply 2 to the electromagnetic contactor 18 may be used, instead of the breaker 19.

The DC link, which connects the DC output side of the rectifier 11 and the DC input side of the inverter 12, is provided with a DC link capacitor 20. The DC link capacitor 20 has functions of accumulating DC power to be used for AC power generation by the inverter 12 and curtailing pulsation in the DC output of the rectifier 11. The DC link capacitor 20 may be, for example, an electrolytic capacitor, a film capacitor, or the like.

The inverter 12 is connected with the rectifier 11 via the DC link and converts DC power in the DC link to AC power for driving a motor and outputs the AC power. The inverter 12 need only have a configuration to convert DC power to AC current and may be, for example, a PWM control system inverter with internal switching devices, or the like. The inverter 12 is configured to be a three-phase bridge circuit when the motor 3 is a three-phase AC motor, and configured to be a single-phase bridge circuit when the motor 3 is a single-phase motor. In the example illustrated in the drawing, the inverter 12 is configured to be a three-phase bridge circuit as the motor 3 is a three-phase AC motor. When the inverter 12 is configured to be a PWM control system inverter, it is configured by a bridge circuit including rectifying devises and switching devices in reverse-parallel connection with the rectifying devises. In this case, the switching devices may be, for example, FETS, IGBTs, thyristors, gate turn-off thyristors (GTOs), or transistors, or may be other semiconductor devices. The inverter 12 converts DC power in the DC link to AC power for driving a motor and outputs the AC power by the on-off operations of the internal switching devices, which are PWM-controlled based on the commands from a superordinate control device (not illustrated). The speed, the torque, or the position of the rotor of the motor 3 is controlled based on the AC power supplied from the inverter 12. Note that the inverter 12 can convert AC power regenerated by the motor 3 to DC power and return the DC power to the DC link on the DC side by the on-off operations of the switching devices, which are properly PWM-controlled.

The DC link voltage detection unit 13 detects DC link voltage, which is voltage between the terminals of the DC link. In other words, the DC link voltage detection unit 13 detects a value of the potential difference between the positive potential at the positive terminal on the DC output side of the rectifier 11 and the negative potential at the negative terminal on the DC output side of the rectifier 11 as DC link voltage. Alternatively, the DC link voltage detection unit 13 may detect voltage applied between the positive and negative terminals of the DC link capacitor 20 as DC link voltage. The value of the DC link voltage detected by the DC link voltage detection unit 13 is sent to the DC link voltage comparison unit 15.

The DC link voltage comparison unit 15 compares the DC link voltage with a first voltage threshold value $V_{th1}$ and with a second voltage threshold value $V_{th2}$, which is set at a higher value than the first voltage threshold value $V_{th1}$. DC link voltage somewhat pulsates even when the motor drive apparatus 1 is driving the motor 3 normally, without any failure, in a state in which the electromagnetic contactor 18 and the breaker 19 are closed and there is no power failure in the AC power supply 2 (to be simply referred to as "normal state", hereinafter). The first voltage threshold value $V_{th1}$ is set at a value smaller than the DC link voltage decreased by pulsation occurring in the normal state when the motor drive apparatus 1 is driving the motor 3. The second voltage threshold value $V_{th2}$ is set at a value greater than the DC link voltage increased by pulsation occurring in the normal state when the motor drive apparatus 1 is driving the motor 3. The first voltage threshold value $V_{th1}$ and the second voltage threshold value $V_{th2}$ may appropriately be set by finding in advance the application environment of the motor drive apparatus 1, the relationship between the voltage value on the DC output side of the rectifier 11 and the presence or absence of an alarm signal outputted from the motor drive apparatus 1, and the like by, for example, operating the motor drive apparatus 1 in experiment or during the actual operation or by computer simulation. To give an example, since the target value of DC link voltage in the normal state is, in general, set in accordance with the application environment of the motor drive apparatus 1, the first voltage threshold value $V_{th1}$ may be set at a value smaller than this target value by about tens of percent while the second voltage threshold value $V_{th2}$ may be set at a value greater than this target value by about tens of percent. The example values that have been indicated here are intended to be merely an example and other values may be used. Note that the first voltage threshold value $V_{th1}$ and the second voltage threshold value $V_{th2}$ may be stored in a rewritable memory unit (not illustrated) to be rewritable from an external device so that, even after being set at certain values, the first voltage threshold value $V_{th1}$ and the second voltage threshold value $V_{th2}$ can be reset at appropriate values as necessary.

The DC link voltage is in the normal state when the DC link voltage stays in the range defined between the first voltage threshold value $V_{th1}$ and the second voltage threshold value $V_{th2}$. On the other hand, a DC link voltage smaller than the first voltage threshold value $V_{th1}$ indicates a state of significantly decreased DC link voltage and a DC link voltage greater than the second voltage threshold value $V_{th2}$ indicates a state of significantly increased DC link voltage. The DC link voltage comparison unit 15 compares the DC link voltage with the first voltage threshold value $V_{th1}$ and compares the DC link voltage with the second voltage threshold value $V_{th2}$. The results of comparison by the DC link voltage comparison unit 15 are sent to the abnormality detection unit 17.

The input current detection unit 14 detects input current inputted from the AC input side to the rectifier 11, i.e., input current inputted from the electromagnetic contactor 18 to the AC input side of the rectifier 11. In the example illustrated in the drawing, the AC power supply 2 is a three-phase AC power supply and a three-phase AC input current flows from the electromagnetic contactor 18 to the AC input side of the rectifier 11; yet the input current detection unit 14 detects, for example, two phases of the three phases of the input current. Alternatively, the input current detection unit 14 may detect one phase or the three phases of the three phases of the input current. The value of the input current detected by the input current detection unit 14 is sent to the current comparison unit 16.

The current comparison unit 16 compares input current with a current threshold value $I_{th}$. The current threshold value $I_{th}$ is used for determining whether or not there is input current flowing from the electromagnetic contactor 18 to the AC input side of the rectifier 11. The current threshold value $I_{th}$ may be appropriately set by finding in advance the application environment of the motor drive apparatus 1, the intensity of the input current flowing from the electromagnetic contactor 18 to the AC input side of the rectifier 11, and the like by, for example, operating the motor drive apparatus 1 in experiment or during the actual operation or by computer simulation. To give an example, current threshold value $I_{th}$ may be set at about several percent of the rated input current, taking into account the detection error of the input current detection unit 14. The example value that has been indicated here is intended to be merely an example and other values may be used. An input current smaller than the current threshold value $I_{th}$ indicates that no input current is flowing from the electromagnetic contactor 18 to the AC input side of the rectifier 11. An input current greater than the current threshold value $I_{th}$ indicates that an input current is flowing from the electromagnetic contactor 18 to the AC input side of the rectifier 11. The result of comparison by the current comparison unit 16 is sent to the abnormality detection unit 17. Note that current threshold value $I_{th}$ may be stored in a rewritable memory unit (not illustrated) to be rewritable from an external device so that, even after being set at a certain value, the current threshold value $I_{th}$ can be reset at an appropriate value as necessary.

In the example illustrated in the drawing, the input current detection unit 14 detects two phases of the input current and the current comparison unit 16 compares the input current with the current threshold value $I_{th}$ for each of the two phases. The current comparison unit 16 determines that "the input current is smaller than the current threshold value $I_{th}$" when the input current is smaller than the current threshold value $I_{th}$ for at least one of the two phases. Alternatively, the current comparison unit 16 may convert the two phases of input current detected by the input current detection unit 14 into a vector norm on two-phase coordinates and determine that "the input current is smaller than the current threshold value $I_{th}$" when the vector norm is smaller than the current threshold value $I_{th}$.

In a case in which the input current detection unit 14 detects three phases of the input current, the current comparison unit 16 compares the input current with the current threshold value $I_{th}$ for each of the three phases. The current comparison unit 16 determines that "the input current is smaller than the current threshold value $I_{th}$" when the input current is smaller than the current threshold value $I_{th}$ for at least one of the three phases. Alternatively, the current comparison unit 16 may apply three-phase to two-phase conversion to the three phases of the input current detected by the input current detection unit 14, convert the resulting two phases into a vector norm on two-phase coordinates, and determine that "the input current is smaller than the current threshold value $I_{th}$" when the vector norm is smaller than the current threshold value $I_{th}$.

In a case in which the input current detection unit 14 detects a single-phase input current, the current comparison unit 16 compares the single-phase input current with the current threshold value $I_{th}$. The current comparison unit 16 determines that "the input current is smaller than the current threshold value $I_{th}$" when the single-phase input current is smaller than the current threshold value $I_{th}$.

In a case in which the DC link voltage comparison unit 15 has determined either that the DC link voltage is smaller than the first voltage threshold value $V_{th1}$ or that the DC link voltage is greater than the second voltage threshold value $V_{th2}$, the abnormality detection unit 17 determines that a first abnormality has occurred when the current comparison unit 16 has determined that the input current is smaller than the current threshold value $I_{th1}$ and determines that a second abnormality has occurred when the current comparison unit 16 has determined that the input current is equal to or greater than the current threshold value $I_{th1}$.

The "first abnormality", which is one of the determination results by the abnormality detection unit 17, includes at least one of a prolonged power failure of the AC power supply 2, a momentary power failure of the AC power supply 2, a state of the current path being open caused by the electromagnetic contactor 18, which is the first switching unit, and a state of the current path being open caused by the breaker 19, which is the second switching unit. When the current comparison unit 16 has determined that the input current is smaller than the current threshold value $I_{th1}$, there is no input current flowing from the electromagnetic contactor 18 to the AC input side of the rectifier 11. No input current flows from the electromagnetic contactor 18 to the AC input side of the rectifier 11 when there occurs one of a prolonged power failure of the AC power supply 2, a momentary power failure of the AC power supply 2, a state of the current path being open caused by the electromagnetic contactor 18, which is the first switching unit, and a state of the current path being open caused by the breaker 19, which is the second switching unit. Thus, in the present embodiment, in a case in which the DC link voltage has been determined to be smaller than the first voltage threshold value $V_{th1}$ or the DC link voltage has been determined to be greater than the second voltage threshold value $V_{th2}$, the abnormality detection unit 17 determines that a first abnormality has occurred when the input current has been determined to be smaller than the current threshold value $I_{th1}$ (i.e., when no input current is flowing from the electromagnetic contactor 18 to the AC input side of the rectifier 11). Note that, according to common interpretation, a state of the current path being open caused by the electromagnetic contactor 18 or the breaker 19 is rarely recognized as "abnormal". In the present embodiment, a "state of the current path being open caused by the electromagnetic contactor 18 or the breaker 19" is included in the definition of the "first abnormality" because a state of the current path being open caused by the electromagnetic contactor 18 or the breaker 19 can be a cause of a significant decrease or increase in DC link voltage.

The "second abnormality", which is one of the determination results by the abnormality detection unit 17, includes at least one of a failure in the motor drive apparatus 1, an overload on the motor drive apparatus 1, and a capacity shortage of the AC power supply 2. When the current comparison unit 16 has determined that the input current is equal to or greater than the current threshold value $I_{th1}$, there is an input current flowing from the electromagnetic contactor 18 to the AC input side of the rectifier 11. As a possible cause of a significant increase or decrease in DC link voltage despite an input current flowing from the electromagnetic contactor 18 to the AC input side of the rectifier 11, a failure in the motor drive apparatus 1 itself is suspected, among others. Further, when a proper load is connected with the inverter 12 in the motor drive apparatus 1, the AC power taken in from the AC power supply 2 to the rectifier 11 is balance with the AC power supplied from the inverter 12 to the load (motor 3) and the DC link voltage is supposed to take a constant value, which is almost the same as the target value, even though there may be some pulsation. When an overload is connected to the inverter 12 in the motor drive apparatus 1, however, the AC power taken in from the AC power supply 2 to the rectifier 11 is out of balance with the AC power supplied from the inverter 12 to the load (motor 3), resulting in a greater consumption than usual of DC power accumulated in the DC link capacitor 20. Further, when the capacity of the AC power supply 2 is insufficient relative to the motor drive apparatus 1, again, the AC power taken in from the AC power supply 2 to the rectifier 11 is out of balance with the AC power supplied from the inverter 12 to the load (motor 3), resulting in a greater consumption than usual of DC power accumulated in the DC link capacitor 20. There occurs a significant decrease in DC link voltage also in these cases with greater consumption than usual of DC power. Thus, in the present embodiment, in a case in which the DC link voltage has been determined to be smaller than the first voltage threshold value $V_{th1}$ or the DC link voltage has been determined to be greater than the second voltage threshold value $V_{th2}$, the abnormality detection unit 17 determines that the second abnormality has occurred when the input current has been determined to be equal to or greater than the current threshold value $I_{th1}$ (i.e., an input current is flowing from the electromagnetic contactor 18 to the AC input side of the rectifier 11).

The display unit 23 displays results of determination by the abnormality detection unit 17. Examples of the display unit 23 include displays, display components of personal computers, mobile terminals, and touch panels, and the like and these may be those appurtenant to the motor drive apparatus 1 or appurtenant to an apparatus superordinate thereto. The display unit 23 displays, for example, an indication "First Abnormality Occurred" or "Second Abnormality Occurred". When not displaying one of "First Abnormality Occurred" and "Second Abnormality Occurred", the display unit 23 may display no indication or an indication "Normal". Note that, with respect to "First Abnormality Occurred", the display unit 23 may display a more detailed indication like "One of these have occurred: a prolonged power failure of the AC power supply, a momentary power failure of the AC power supply, a state of the current path being open caused by the electromagnetic contactor, and a state of the current path being open caused by the breaker." Similarly, with respect to "Second Abnormality Occurred", the display unit 23 may display a more detailed indication like "One of these have occurred: a failure in the motor drive apparatus, an overload on the motor drive apparatus, a capacity shortage of the AC power supply." The above-described example indications by the display unit 23 are intended to be merely an example, and the display unit 23 may display indications of "First Abnormality Occurred", "Second Abnormality Occurred", and "Normal" in other expressions or pictures. Alternatively, an audio device that makes voice or sound such as a speaker, a buzzer, and chimes may be used instead of the display unit 23. When an audio device is used for informing the operator of results of determination by the abnormality detection unit 17, tones, scales, rhythms, melodies, and the like may be selected, for example, in a manner that allows the distinction between "First Abnormality Occurred" and "Second Abnormality Occurred". In this case, the audio device preferably remains silent when neither "First Abnormality Occurred" nor "Second Abnormality Occurred" is to be indicated. Alternatively still, a printer may be used for presenting an indication by making a print on paper or the like. Alternatively, these may be combined as appropriate.

According to the present embodiment, the operator can determine the cause of a significant decrease or increase in DC link voltage easily and accurately, based on a result of determination by the abnormality detection unit 17. Further, the operator can take accurate measures speedily in response to the cause of the significant decrease or increase in DC link voltage.

For example, when the abnormality detection unit 17 has determined that the "first abnormality" has occurred, the operator recognizes that the cause of the significant decrease or increase in DC link voltage is one of a prolonged power failure of the AC power supply 2, a momentary power failure of the AC power supply 2, a state of the current path being open caused by the electromagnetic contactor 18, which is the first switching unit, and a state of the current path being open caused by the breaker 19, which is the second switching unit. Thus, the operator does not erroneously think that there is a failure in the motor drive apparatus 1, which is working normally, and the operator will not replace the normal motor drive apparatus 1 itself or replace or repair a component inside the motor drive apparatus 1. Further, the operator can immediately start the operation for checking whether the electromagnetic contactor 18 and the breaker 19 are open or closed. As soon as it is confirmed that the electromagnetic contactor 18 or the breaker 19 is open, the operator can quickly start the operation fox resetting the electromagnetic contactor 18 or the breaker 19. Further, when it is confirmed that the electromagnetic contactor 18 and the breaker 19 are closed, the operator can take measures such as restoring the AC power supply 2 or standing by until the AC power supply 2 is restored.

For example, when the abnormality detection unit 17 has determined that the "second abnormality" has occurred, the operator recognizes that the cause of the significant decrease or increase in DC link voltage is one of a failure in the motor drive apparatus 1, an overload on the motor drive apparatus 1, and a capacity shortage of the AC power supply 2. Thus, the operator can immediately start the operation for checking the state of the load on the motor drive apparatus 1 and the capacity of the AC power supply 2. As soon as it is confirmed that the cause of the significant decrease or increase in DC link voltage is an overload on the motor drive apparatus 1 or a capacity shortage of the AC power supply 2, the operator can immediately start taking measures such as changing the design of the motor drive apparatus 1 and enhancing the capacity of the AC power supply 2. Further, when it is confirmed that there is no problem with the state of the load on the motor drive apparatus 1 or with the capacity of the AC power supply 2, the operator recognizes that there is a failure in the motor drive apparatus 1 and can efficiently perform the operation for replacing the motor drive apparatus 1 itself or for replacing or repairing a component inside the motor drive apparatus 1.

The DC link voltage comparison unit 15, the current comparison unit 16, and the abnormality detection unit 17 (including those in the modification example to be described later) may, for example, be configured with a software program, a combination of various electronic circuits and a software program, or various electronic circuits alone. When, for example, these are configured with a software program, the functions of the above-described units can be implemented, for example, by running an arithmetic processing unit such as DSP or FPGA according to the software program. Alternatively, the DC link voltage comparison unit 15, the current comparison unit 16, and the abnormality detection unit 17 (including those in the modification example to be described later) may be implemented as a semiconductor integrated circuit in which a software program is written for implementing the functions of these units. Alternatively still, the DC link voltage comparison unit 15, the current comparison unit 16, and the abnormality detection unit 17 (including those in the modification example to be described later) may be implemented as a recording medium in which a software program is written for implementing the functions of these units. Further, DC link voltage comparison unit 15, the current comparison unit 16, and the abnormality detection unit 17 (including those in the modification example to be described later) may be provided, for example, in a numerical control apparatus of a machine tool or may be provided in a robot controller for controlling a robot.

Further, the DC link voltage detection unit 13 and the input current detection unit 14 may be configured by a combination of an analog circuit and a digital circuit, may be implemented by an arithmetic processing unit constituted with a software program, or may be configured by an analog circuit alone. Note that devices commonly provided for the motor drive apparatus 1 may also be used as the DC link voltage detection unit 13 and the input current detection unit 14.

Further, the memory unit in which the first voltage threshold value $V_{th1}$, the second voltage threshold value $V_{th2}$, and the current threshold value $I_{th}$ are stored may be configured by, for example, electrically erasable programmable nonvolatile memory such as EEPROM (registered trademark) or, for example, readable and writable high-speed random access memory such as DRAM and SRAM, or the like.

Figure 2:
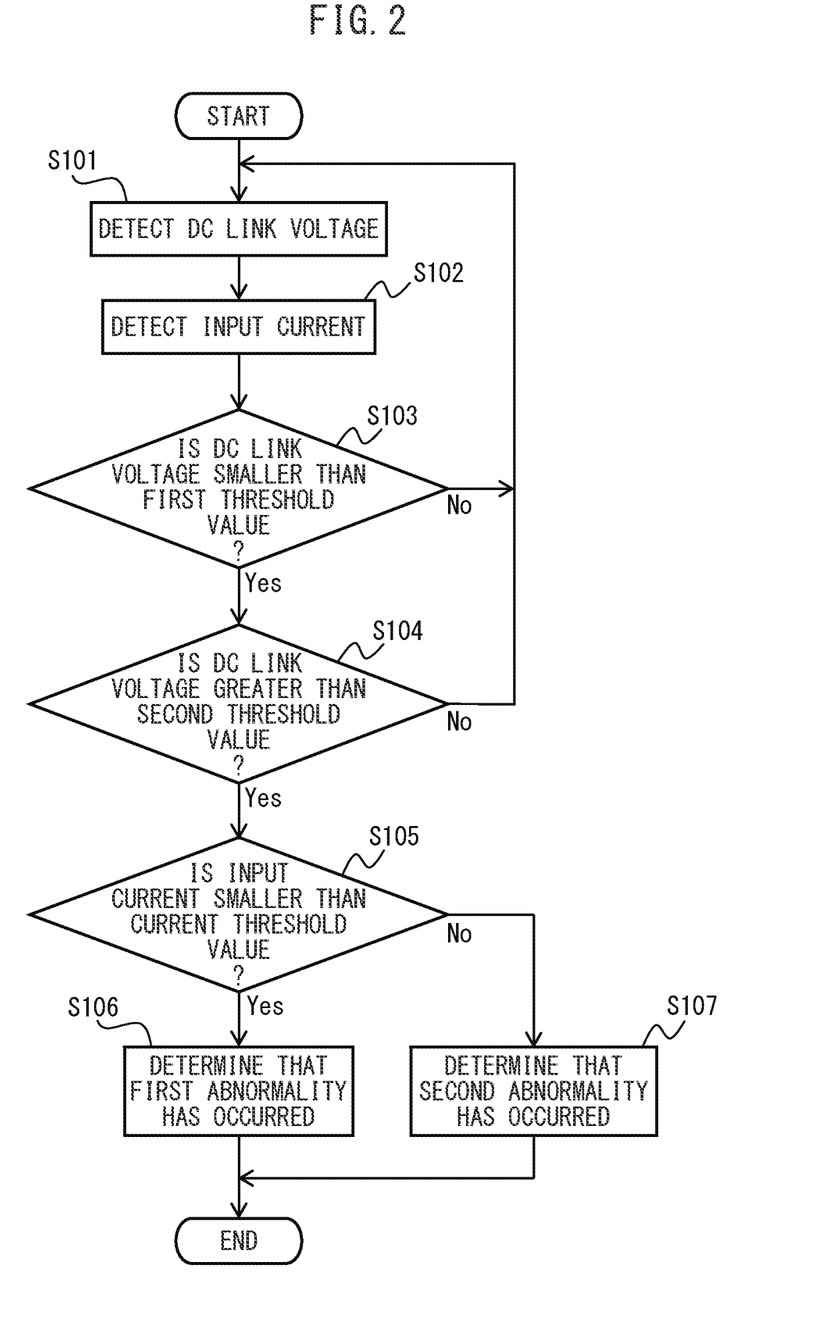
FIG. 2 is a flowchart illustrating an operation flow of the motor drive apparatus according to one embodiment of the present disclosure.

FIG. 2 is a flowchart illustrating an operation flow of the motor drive apparatus according to one embodiment of the present disclosure.

When the motor drive apparatus 1 drives the motor 3, the DC link voltage detection unit 13 detects DC link voltage, which is voltage between the terminals of the DC link, in Step S101. The value of DC link voltage detected by the DC link voltage detection unit 13 is sent to the DC link voltage comparison unit 15.

In Step S102, the input current detection unit 14 detects the input current inputted from the AC input side, to the rectifier 11, i.e., the input current inputted from the electromagnetic contactor 18 to the AC input side of the rectifier 11. The value of the input current detected by the input current detection unit 14 is sent to the current comparison unit 16.

Note that the processing for the DC link voltage detection in Step S101 and the processing for the input current detection in Step S102 may be executed in reverse order.

In Step S103, the DC link voltage comparison unit 15 compares the DC link voltage with the first voltage threshold value $V_{th1}$ and determines whether or not the DC link voltage is smaller than the first voltage threshold value $V_{th1}$. When the DC link voltage has been determined to be smaller than the first voltage threshold value $V_{th1}$ in Step S103, the process proceeds to Step S104 and, when the DC link voltage has been determined to be equal to or greater than the first voltage threshold value $V_{th1}$, the process returns to Step S101. The result of comparison by the DC link voltage comparison unit 15 in Step S103 is sent to the abnormality detection unit 17.

In Step S104, the DC link voltage comparison unit 15 compares the DC link voltage with the second voltage threshold value $V_{th2}$ and determines whether or not the DC link voltage is greater than the second voltage threshold value $V_{th2}$. When the DC link voltage has been determined to be greater than the second voltage threshold value $V_{th2}$ in Step S104, the process proceeds to Step S105 and, when the DC link voltage has been determined to be equal to or smaller than the second voltage threshold value $V_{th2}$, the process returns to Step S101. The result of comparison by the DC link voltage comparison unit 15 in Step S104 is sent to the abnormality detection unit 17.

Note that the processing for the DC link voltage comparison in Step S103 and the processing for the DC link voltage comparison in Step S104 may be executed in reverse order.

In Step S105, the current comparison unit 16 compares the input current with the current threshold value $I_{th}$ and determines whether or not the input current is smaller than the current threshold value $I_{th}$. When the input current has been determined to be smaller than the current threshold value $I_{th}$ in Step S105, the process proceeds to Step S106 and, when the input current has been determined to be equal to or greater than the current threshold value $I_{th}$, the process proceeds to Step S107. The result of comparison by the current comparison unit 16 at Step S105 is sent to the abnormality detection unit 17.

Note that the processing for input current detection in Step S102 may be executed between the processing for DC link voltage comparison in Step S104 and the processing for input current comparison in Step S105.

In Step S106, the abnormality detection unit 17 determines that the first abnormality has occurred. The first abnormality includes at least one of a prolonged power failure of the AC power supply 2, a momentary power failure of the AC power supply 2, a state of the current path being open caused by the electromagnetic contactor 18, which is the first switching unit, and a state of the current path being open caused by the breaker 19, which is the second switching unit.

In Step S107, the abnormality detection unit 17 determines that the second abnormality has occurred. The second abnormality includes at least one of a failure in the motor drive apparatus 1, an overload on the motor drive apparatus 1, and a capacity shortage of the AC power supply 2.

Although it is not illustrated in FIG. 2, after the processing for abnormality determination in Steps S106 and S107, the display unit 23 may display the result of determination by the abnormality detection unit 17.

The above-described series of processing from Step S101 to S107 are repeatedly executed at a certain period until, for example, the abnormality detection unit 17 detects the first abnormality or the second abnormality.

Next, a modification example of the motor drive apparatus 1 according to one embodiment of the present disclosure will be described with reference to FIG. 3 and FIG. 4. The present modification example further enables a discrimination between cases included in the first abnormality, namely, a momentary power failure of the AC power supply 2, a prolonged power failure of the AC power supply 2 or a state of the current path being open caused by the breaker 19, which is the second switching unit, and a state of the current path being open caused by the electromagnetic contactor 18, which is the first switching unit.

Figure 3:
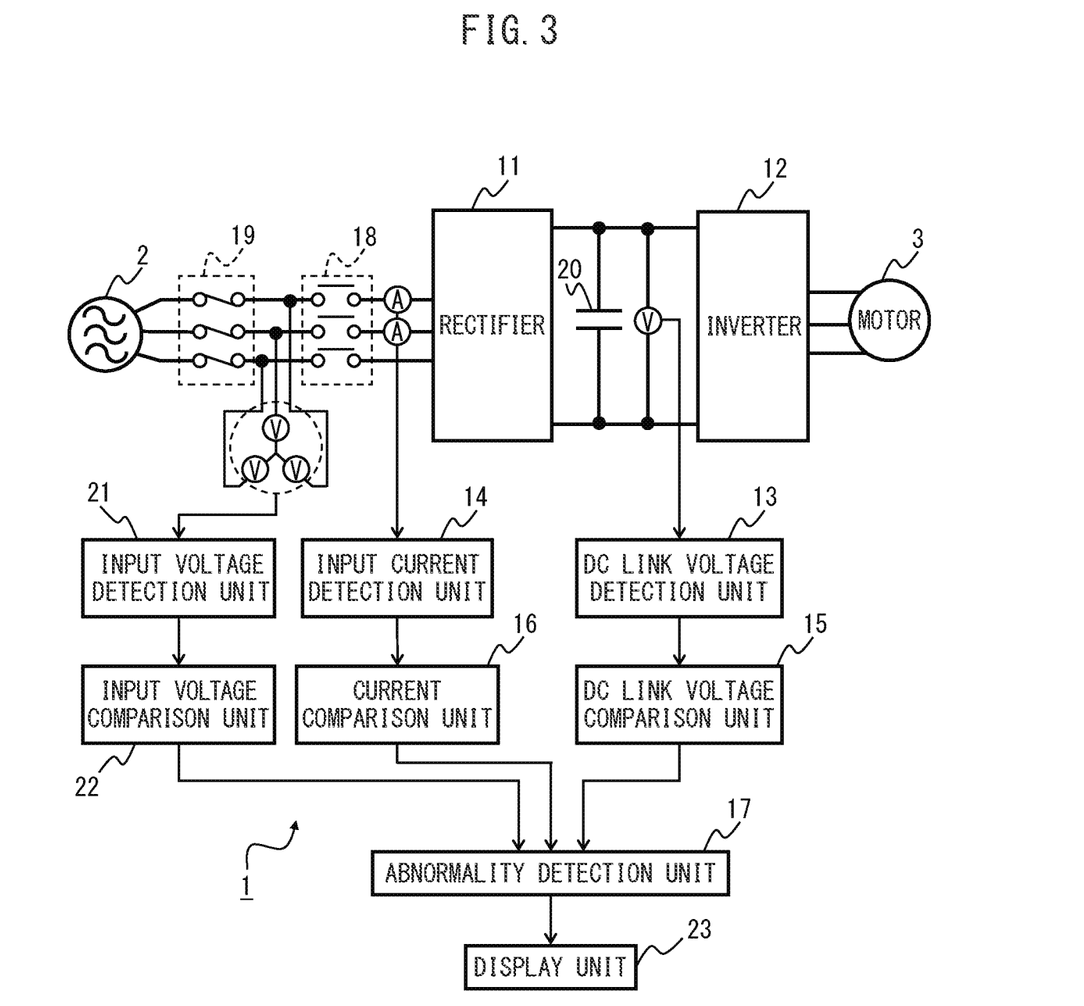
FIG. 3 is a diagram of a motor drive apparatus according to a modification example of one embodiment of the present disclosure.

FIG. 3 is a diagram of a motor drive apparatus according to a modification example of one embodiment of the present disclosure.

As illustrated in FIG. 3, the motor drive apparatus 1 according to the present modification example further includes an input voltage detection unit 21 and an input voltage comparison unit 22. The components that constitute the circuit, except the input voltage detection unit 21 and the input voltage comparison unit 22 as well as the abnormality detection unit 17, are the same as those illustrated in FIG. 1; hence the same circuit-constituting components are indicated by the same reference signs and will not be described in details.

The input voltage detection unit 21 detects input voltage, which is a phase voltage, between the electromagnetic contactor 18, which is the first switching unit, and the breaker 19, which is the second switching unit. In the example illustrated in the drawing, the AC power supply 2 is a three-phase AC power supply and the input voltage detection unit 21 detects the phase voltage for each of the three phases between the electromagnetic contactor 18 and the breaker 19. When the AC power supply 2 is a single-phase AC power supply, the input voltage detection unit 21 detects the single-phase voltage between the electromagnetic contactor 18 and the breaker 19. The value of the input voltage detected by the input voltage detection unit 21 is sent to the input voltage comparison unit 22.

When the DC link voltage comparison unit 15 has determined that the DC link voltage is smaller than the first voltage threshold value $V_{th1}$ or that the DC link voltage is greater than the second voltage threshold value $V_{th2}$, the input voltage comparison unit 22 compares the input voltage with the power failure threshold value $V_{th3}$. Further, the input voltage comparison unit 22 also determines whether or not the state in which the input voltage was smaller than the power failure threshold value $V_{th3}$ continued for less than a predefined time period or continued for the predefined time period or more. The power failure threshold value $V_{th3}$ is used for determining whether or not a prolonged power failure or a momentary power failure has occurred in the AC power supply 2. The power failure threshold value $V_{th3}$ may appropriately be set by finding in advance the application environment of the motor drive apparatus 1, an AC voltage at which the motor drive apparatus 1 can drive the motor 3 normally, and the like by, for example, operating the motor drive apparatus 1 in experiment or during the actual operation or by computer simulation. To give an example, the power failure threshold value $V_{th3}$ may be set at a value smaller than the lower limit of AC voltage of the AC power supply 2 at which the motor drive apparatus 1 can drive motor 3 normally by, for example, about tens of percent, to take safety into account. The example value that has been indicated here is intended to be merely an example and other values may be used. Note that the power failure threshold value $V_{th3}$ may be stored in a rewritable memory unit (not illustrated) to be rewritable from an external device so that, even after being set at a certain value, the power failure threshold value $V_{th3}$ can be reset at an appropriate value as necessary. The result of comparison by the input voltage comparison unit 22 is sent to the abnormality detection unit 17. Further, the above-mentioned "predefined time period", which is used for determining whether or not the state in which the input voltage was smaller than the power failure threshold value $V_{th3}$ continued for less than the predefined time period or continued for the predefined time period or more, is set at a value that allows the classification of power failures of the AC power supply 2 into momentary power failures and other prolonged power failures. As momentary power failures of the AC power supply 2 generally tend to indicate power failures of a few seconds or less, the "predefined time period" may be set at about a few seconds (e.g., two seconds). The example value that has been indicated here is intended to be merely an example and other values may be used. Note that the above-mentioned "predefined time period" may be stored in a rewritable memory unit (not illustrated) to be rewritable from an external device so that, even after being set at a certain value, the "predefined time period" can be reset at an appropriate value as necessary. The result of comparison by the input voltage comparison unit 22 is sent to the abnormality detection unit 17.

As described above, the input voltage detection unit 21 detects as input voltage the phase voltage for each of the three phases and so the input voltage comparison unit 22 compares the input voltage for each of the three phases with the power failure threshold value $V_{th3}$. The input voltage comparison unit 22 determines that "the input voltage is lower than the power failure threshold value $V_{th3}$" when the input voltage is smaller than the power failure threshold value $V_{th3}$ for at least one of the three phases. Alternatively, the input voltage comparison unit 22 may, for example, convert the three-phase input voltage to a voltage vector on two-phase coordinates by coordinate transformation and determine that "the input voltage is smaller than the power failure threshold value $V_{th3}$" when the amplitude of the voltage vector is smaller than the power failure threshold value $V_{th3}$.

The abnormality detection unit 17 determines that a momentary power failure of the AC power supply 2 has occurred when the input voltage comparison unit 22 has determined that a state in which the input voltage was equal to or smaller than the power failure threshold value $V_{th3}$ continued for less than a predefined time period. Further, the abnormality detection unit 17 determines that either a state of the current path being open caused by the breaker 19, which is the second switching unit, or a prolonged power failure of the AC power supply 2 has occurred when the input voltage comparison unit 22 has determined that a state in which the input voltage was equal to or smaller than the power failure threshold value $V_{th3}$ continued for the predefined time period or more. Further, the abnormality detection unit 17 determines that a state of the current path being open caused by the electromagnetic contactor 18, which is the first switching unit, has occurred when the input voltage comparison unit 22 has determined that the input voltage is greater than the power failure threshold value $V_{th3}$. The result of comparison by the abnormality detection unit 17 is displayed by the display unit 23.

When, for example, the abnormality detection unit 17 has determined that "a momentary power failure of the AC power supply 2 has occurred", the operator can take measures such as standing by until the AC power supply 2 is restored. When, for example, the abnormality detection unit 17 has determined that "either a state of the current path being open caused by the breaker 19 or a prolonged power failure of the AC power supply 2 has occurred", the operator can immediately start the operation for checking whether the breaker 19 is open or closed. As soon as it is confirmed that the breaker 19 is open, the operator can quickly start the operation for resetting the breaker 19. Further, when it is confirmed that the breaker 19 is closed, the operator can take measures such as restoring the AC power supply 2 or standing by until the AC power supply 2 is restored. When, for example, the abnormality detection unit 17 has determined that "a state of the current path being open caused by the electromagnetic contactor 18 has occurred", the operator can immediately start the operation for resetting the electromagnetic contactor 18.

As described above, the present modification example further enables a discrimination between cases included in the first abnormality, namely, a momentary power failure of the AC power supply 2, a prolonged power failure of the AC power supply 2 or a state of the current path being open caused by the breaker 19, which is the second switching unit, and a state of the current path being open caused by the electromagnetic contactor 18, which is the first switching unit. Note that also in the present modification example, the abnormality detection unit 17 determines that "the second abnormality has occurred" when the current comparison unit 16 has determined that the input current is equal to or greater than the current threshold value $I_{th}$ in a case in which the DC link voltage comparison unit 15 has determined that the DC link voltage is smaller than the first voltage threshold value $V_{th1}$ or that the DC link voltage is greater than the second voltage threshold value $V_{th2}$.

The input voltage comparison unit 22 may, for example, be configured with a software program, a combination of various electronic circuits and a software program, or various electronic circuits alone. When, for example, the unit is configured with a software program, the function of the unit can be implemented, for example, by running an arithmetic processing unit such as DSP or FPGA according to the software program. Alternatively, the input voltage comparison unit 22 may be implemented as a semiconductor integrated circuit in which a software program is written for implementing the function of the unit. Alternatively still, the input voltage comparison unit 22 may be implemented as a recording medium in which a software program is written for implementing the function of the unit. Further, input voltage comparison unit 22 may be provided, for example, in a numerical control apparatus of a machine tool or may be provided in a robot controller for controlling a robot.

Further, the input voltage detection unit 21 may be configured by a combination of an analog circuit and a digital circuit, may be implemented by an arithmetic processing unit constituted with a software program, or may be configured by an analog circuit alone. Note that devices commonly provided for the motor drive apparatus 1 may be used also as the input voltage detection unit 21.

Further, the memory unit in which the power failure threshold value $V_{th3}$ and the "predefined time period" used for determining whether or not the power failure of the AC power supply 2 is a momentary power failure are stored may be configured with, for example, electrically erasable programmable non-volatile memory such as EEPROM (registered trademark) or, for example, readable and writable high-speed random access memory such as DRAM and SRAM, or the like.

Figure 4:
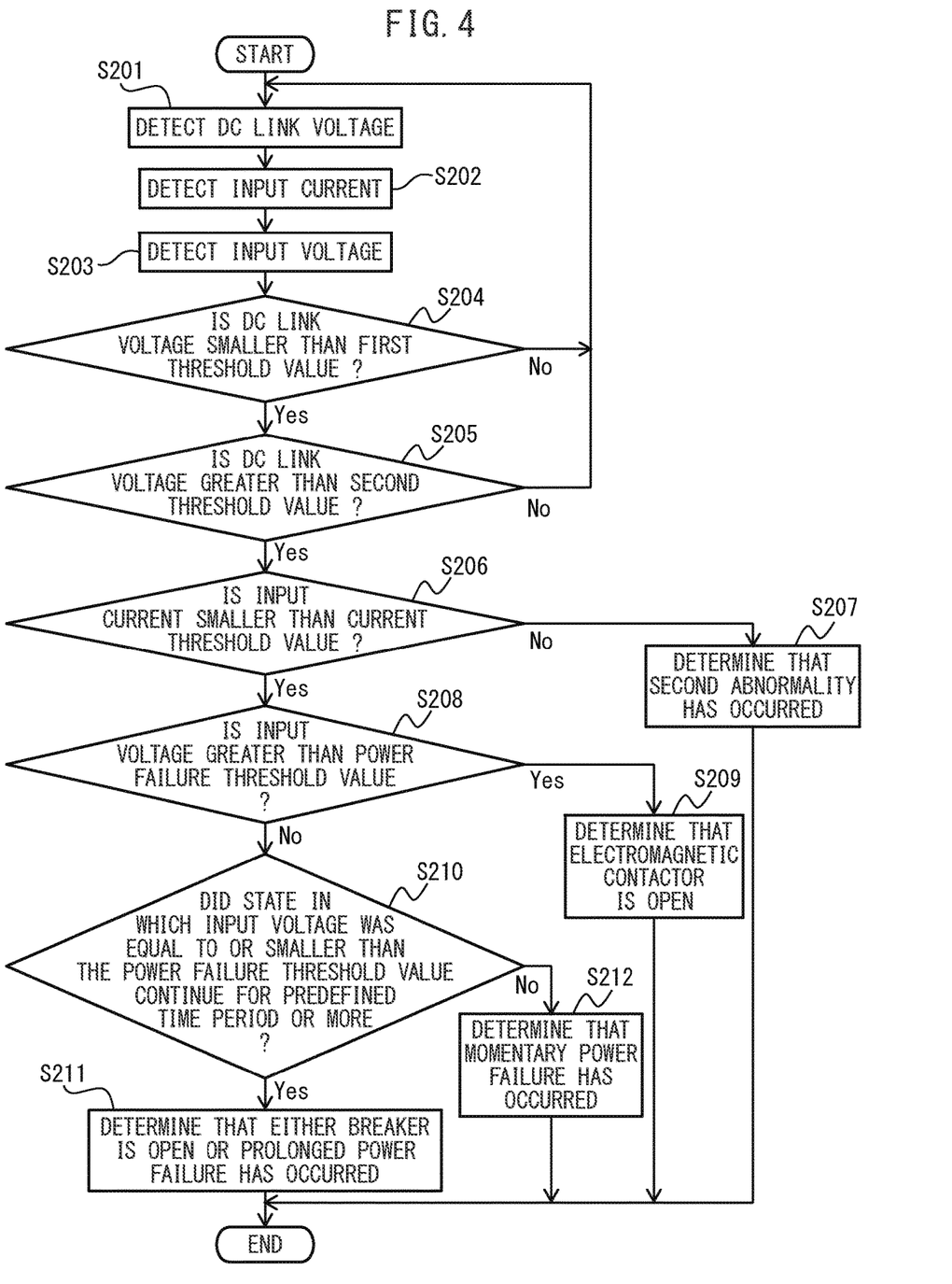
FIG. 4 is a flowchart illustrating an operation flow of the motor drive apparatus according to a modification example of one embodiment of the present disclosure.

FIG. 4 is a flowchart illustrating an operation flow of the motor drive apparatus according to a modification example of one embodiment of the present disclosure.

When the motor drive apparatus 1 drives the motor 3, the DC link voltage detection unit 13 detects DC link voltage, which is voltage between the terminals of the DC link, in Step S201. The value of DC link voltage detected by the DC link voltage detection unit 13 is sent to the DC link voltage comparison unit 15.

In Step S202, the input current detection unit 14 detects the input current inputted from the AC input side to the rectifier 11, i.e., the input current inputted from the electromagnetic contactor 18 to the AC input side of the rectifier 11. The value of the input current detected by the input current detection unit 14 is sent to the current comparison unit 16.

In Step S203, the input voltage detection unit 21 detects the input voltage, which is the phase voltage between the electromagnetic contactor 18, which is the first switching unit, and the breaker 19, which is the second switching unit. The value of the input voltage detected by the input voltage detection unit 21 is sent to the input voltage comparison unit 22.

Note that the processing for the DC link voltage detection in Step S201, the processing for the input current detection in Step S202, and the processing for the input voltage detection in Step S203 may be executed in a different order.

In Step S204, the DC link voltage comparison unit 15 compares the DC link voltage with the first voltage threshold value $V_{th1}$ and determines whether or not the DC link voltage is smaller than the first voltage threshold value $V_{th1}$. When the DC link voltage has been determined to be smaller than the first voltage threshold value $V_{th1}$ in Step S204, the process proceeds to Step S205 and, when the DC link voltage has been determined to be equal to or greater than the first voltage threshold value $V_{th1}$, the process returns to Step S201. The result of comparison by the DC link voltage comparison unit 15 in Step S204 is sent to the abnormality detection unit 17.

In Step S205, the DC link voltage comparison unit 15 compares the DC link voltage with the second voltage threshold value $V_{th2}$ and determines whether or not the DC link voltage is greater than the second voltage threshold value $V_{th2}$. When the DC link voltage has been determined to be greater than the second voltage threshold value $V_{th2}$ in Step S205, the process proceeds to Step S206 and, when the DC link voltage has been determined to be equal to or smaller than the second voltage threshold value $V_{th2}$, the process returns to Step S201. The result of comparison by the DC link voltage comparison unit 15 in Step S205 is sent to the abnormality detection unit 17.

Note that the processing for the DC link voltage comparison in Step S204 and the processing for the DC link voltage comparison in Step S205 may be executed in reverse order.

In Step S206, the current comparison unit 16 compares the input current with the current threshold value $I_{th}$ and determines whether or not the input current is smaller than the current threshold value $I_{th}$. When the input current has been determined to be smaller than the current threshold value $I_{th}$ in Step S206, the process proceeds to Step S208 and, when the input current has been determined to be equal to or greater than the current threshold value $I_{th}$, the process proceeds to Step S207. The result of comparison by the current comparison unit 16 at Step S206 is sent to the abnormality detection unit 17.

Note that the processing for the input current detection in Step S202 may be executed between the processing for the DC link voltage comparison in Step S205 and the processing for the input current comparison in Step S206.

In Step S208, the input voltage comparison unit 22 compares the input voltage with the power failure threshold value $V_{th3}$ and determines whether or not the input voltage is greater than the power failure threshold value $V_{th3}$. When in Step S208 the input voltage has been determined to be greater than the power failure threshold value $V_{th3}$, the process proceeds to Step S209 and, when the input voltage has been determined to be equal to or smaller than the power failure threshold value $V_{th3}$, the process proceeds to Step S210. The result of comparison by the input voltage comparison unit 22 in Step S208 is sent to the abnormality detection unit 17.

In Step S210, the input voltage comparison unit 22 compares the input voltage with the power failure threshold value $V_{th3}$ and determines whether or not a state in which the input voltage was equal to or smaller than the power failure threshold value $V_{th3}$ continued for the predefined time period or more. When in Step S210 it has been determined that a state in which the input voltage was equal to or smaller than the power failure threshold value $V_{th3}$ continued for the predefined time period or more, the process proceeds to Step S211 and, when it has been determined that it continued for less than a predefined time period, the process proceeds to Step S212.

In Step S207, the abnormality detection unit 17 determines that the second abnormality has occurred. The second abnormality includes at least one of a failure in the motor drive apparatus 1, an overload on the motor drive apparatus 1, and a capacity shortage of the AC power supply 2.

In Step S209, the abnormality detection unit 17 determines that a state of the current path being open caused by the electromagnetic contactor 18, which is the first switching unit, has occurred.

In Step S211, the abnormality detection unit 17 determines that either a state of the current path being open caused by the breaker 19, which is the second switching unit, or a prolonged power failure of the AC power supply 2 has occurred.

In Step S212, the abnormality detection unit 17 determines that a momentary power failure of the AC power supply 2 has occurred.

Although not illustrated in FIG. 4, the display unit 23 may display the result of determination by the abnormality detection unit 17 after the processing for abnormality determination in Steps S207, S209, S211, and S212.

The series of processing from Steps S201 to S212 are repeatedly executed at a certain period until, for example, the abnormality detection unit 17 detects a prolonged power failure of the AC power supply 2, a momentary power failure of the AC power supply 2, a state of the current path being open caused by the electromagnetic contactor 18, a state of the current path being open caused by the breaker 19, or the second abnormality.

According to one aspect of the present disclosure, a motor drive apparatus in which a rectifier and an inverter are connected via a DC link can identify easily and accurately the cause of a significant decrease or increase in DC link voltage.

The invention claimed is:

1. A motor drive apparatus comprising:
   a rectifier configured to convert AC power inputted from an AC input side to DC power and to output the DC power to a DC link which is on a DC output side;
   an inverter configured to convert DC power in the DC link to AC power for driving a motor and to output the AC power;
   a DC link voltage detection unit configured to detect DC link voltage, which is voltage between terminals of the DC link;
   an input current detection unit configured to detect input current inputted to the rectifier from the AC input side;
   a DC link voltage comparison unit configured to compare the DC link voltage with a first voltage threshold value and with a second voltage threshold value, which is set at a greater value than the first voltage threshold value;

a current comparison unit configured to compare the input current with a current threshold value; and an abnormality detection unit configured, in a case in which the DC link voltage comparison unit has determined that the DC link voltage is smaller than the first voltage threshold value or that the DC link voltage is greater than the second voltage threshold value, to determine that a first abnormality has occurred when the current comparison unit has determined that the input current is smaller than the current threshold value and to determine that a second abnormality has occurred when the current comparison unit has determined that the input current is equal to or greater than the current threshold value.

2. The motor drive apparatus according to claim 1, further comprising:

a first switching unit provided on the AC input side of the rectifier and configured to open and close a current path of the input current from the AC input side to the rectifier; and a second switching unit provided between an AC power supply, which is a supply source of AC power inputted to the rectifier, and the first switching unit and configured to open and close a current path from the AC power supply to the first switching unit.

3. The motor drive apparatus according to claim 2, wherein the first abnormality includes at least one of a prolonged power failure of the AC power supply, a momentary power failure of the AC power supply, a state of the current path being open caused by the first switching unit, and a state of the current path being open caused by the second switching unit, and wherein the second abnormality includes at least one of a failure in the motor drive apparatus, an overload on the motor drive apparatus, and a capacity shortage of the AC power supply.

4. The motor drive apparatus according to claim 3, further comprising:

an input voltage detection unit configured to detect input voltage, which is phase voltage between the first switching unit and the second switching unit; and an input voltage comparison unit configured to compare the input voltage with a power failure threshold value when the DC link voltage comparison unit has determined that the DC link voltage is smaller than the first voltage threshold value or that the DC link voltage is greater than the second voltage threshold value, wherein the abnormality detection unit determines that a momentary power failure of the AC power supply has occurred when the input voltage comparison unit has determined that a state in which the input voltage is equal to or smaller than the power failure threshold value continued for less than a predefined time period, and determines that either a state of the current path being open caused by the second switching unit or a prolonged power failure of the AC power supply has occurred when the input voltage comparison unit has determined that a state in which the input voltage is equal to or smaller than the power failure threshold value continued for the predefined time period or more.

5. The motor drive apparatus according to claim 4, wherein the abnormality detection unit determines that a state of the current path being open caused by the first switching unit has occurred when the input voltage comparison unit has determined that the input voltage is greater than the power failure threshold value.

6. The motor drive apparatus according to claim 2, wherein the first switching unit is an electromagnetic contactor.

7. The motor drive apparatus according to claim 2, wherein the second switching unit is a breaker.

* * * * *